United States Patent [19]

Witherell

[11] Patent Number: 5,045,117

[45] Date of Patent: Sep. 3, 1991

[54] SYSTEM FOR REMOVING FLUX RESIDUES FROM PRINTED WIRING ASSEMBLIES

[75] Inventor: Donald R. Witherell, Cedar Rapids, Iowa

[73] Assignee: Rockwell International Corporation, El Segundo, Calif.

[21] Appl. No.: 586,099

[22] Filed: Sep. 18, 1990

[51] Int. Cl.⁵ ............................................... B08B 5/04
[52] U.S. Cl. ..................................... 134/21; 134/25.4; 134/95; 134/108; 134/109
[58] Field of Search ................... 134/21, 25.4, 95, 108, 134/109

[56] References Cited

U.S. PATENT DOCUMENTS 4,591,390  5/1986  Scott et al. ............................ 134/21
4,635,666  1/1987  Daley et al. ........................... 134/95

FOREIGN PATENT DOCUMENTS 0081393  3/1989  Japan ..................................... 134/21

*Primary Examiner*—Theodore Morris
*Assistant Examiner*—Zeinab El-Arini
*Attorney, Agent, or Firm*—John J. Horn; M. Lee Murrah; H. Frederick Hamann

[57] ABSTRACT

A method and apparatus are provided for cleaning rosin flux residues off of printed wiring assemblies. In accordance with the invention printed wiring assemblies are placed within a processing chamber and a vacuum pump is used to draw a vacuum within the processing chamber. The rosin flux residues are then washed off of the printed wiring assemblies using a solvent for dissolving and removing the flux residues.

13 Claims, 1 Drawing Sheet

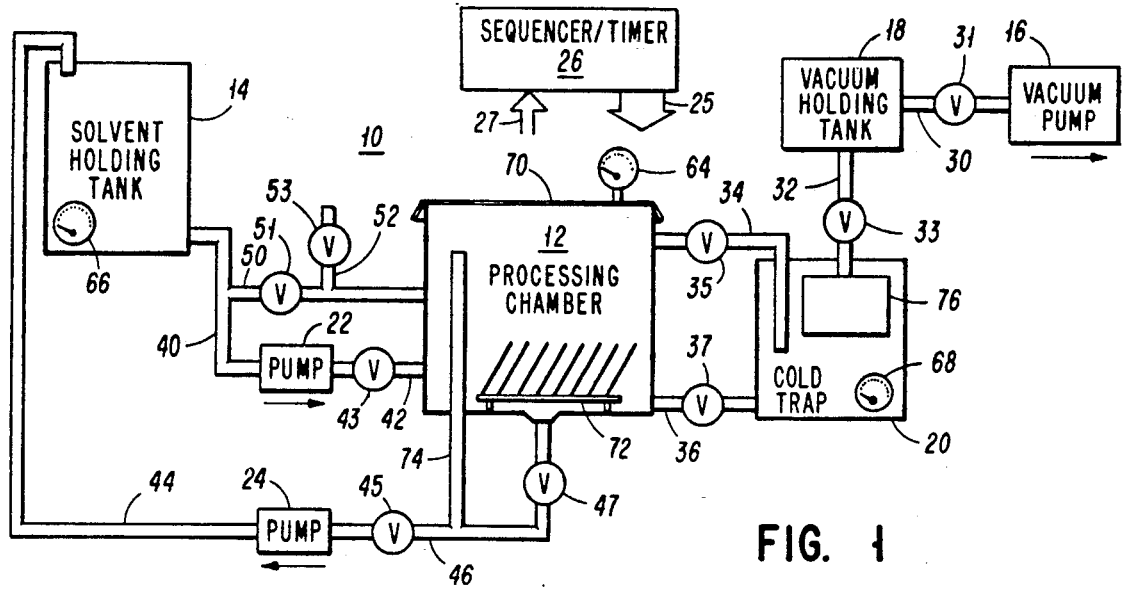
FIG. 1
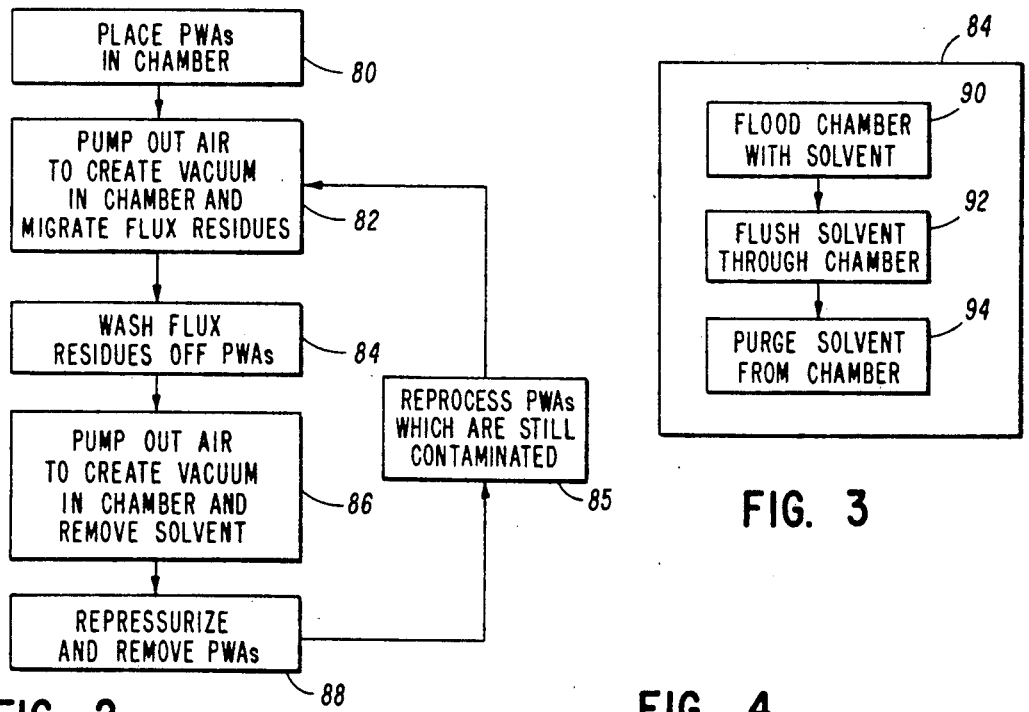
FIG. 2
FIG. 3
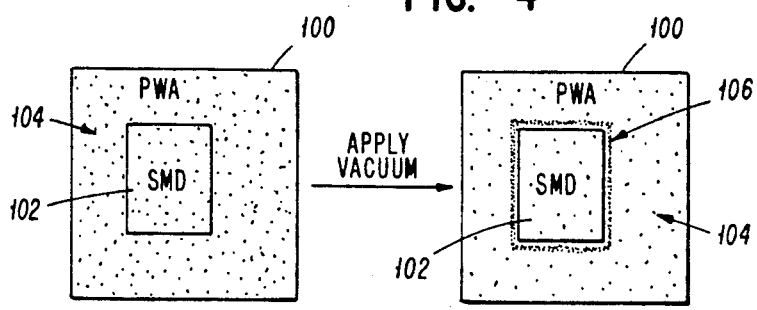
FIG. 4

SYSTEM FOR REMOVING FLUX RESIDUES FROM PRINTED WIRING ASSEMBLIES

BACKGROUND OF THE INVENTION

The present invention relates to techniques for use in the manufacture of printed wiring assemblies and more particularly to systems for cleaning rosin flux residues off of printed wiring assemblies.

Whenever integrated circuit chips or other components are mounted on printed wiring assemblies and electrical contact is made by soldering whether it be wave, vapor phase or hand soldering, substantial amounts of rosin flux and associated activators and decomposition products are left as contaminants on the wiring assembly. The removal of these rosins flux residues from the confined spaces on the printed wiring assemblies, and especially from the low clearance areas under surface mounted devices (SMDs), has been a troublesome problem. This problem has held back the greater use of leadless devices because of their lower component-to-substrate clearances.

A number of methods for removing rosin flux residues have been tried and have been partially successful. High pressure sprays of solvent material directed at low angles to individual parts mounted on the printed wiring assemblies have been found to be somewhat effective. However, heavy populations of parts in small areas and the unidirectional nature of such sprays make it difficult to concentrate the flow of spray and assure that all areas are sufficiently cleaned. In any event, total removal of flux is difficult to achieve with this technique and, furthermore, small parts and solder joints are sometimes damaged by high pressure spraying.

Rosin flux residues have also been removed from printed wiring assemblies by vapor degreasing methods. However, it has been found that extended cleaning times are necessary to remove flux residues from confined spaces such as the areas beneath SMDs and that board surfaces assembled parts and part markings are often attacked by degreasing solvents. Ultrasonic cleaning has been proposed as a method to remove rosin flux residues but is not currently used because there are reasons to believe that sensitive parts and solder joints may be damaged by ultrasonic energy.

It is therefore an object of the present invention to provide a method and apparatus for efficiently and effectively cleaning rosin flux residues from printed wiring assemblies and the confined spaces on such assemblies.

It is another object of the present invention to provide a method for cleaning rosin flux residues from printed wiring assemblies which does not risk damage to the chips, components, solder joints and other parts making up the wiring assemblies.

It is a further object of the present invention to provide a method for cleaning rosin flux residues from printed wiring assemblies which is efficient and effective yet is simple and economic to perform.

SUMMARY OF THE INVENTION

The present invention constitutes a method and apparatus for effectively and efficiently cleaning rosin flux residues from printed wiring assemblies without damaging such assemblies. The apparatus of the invention comprises a processing chamber in which a vacuum to be drawn, a vacuum pump and solvent holding tank. The apparatus also includes piping, valving and liquid phase pumps interconnecting the processing chamber, vacuum pump and holding tank so as to enable the vacuum pump to pump air out of the processing chamber and so as to allow the transfer of solvent between the holding tank and the processing chamber.

The method of the present invention involves operation of the apparatus in accordance with a sequence of steps. First, printed wiring assemblies are placed inside the processing chamber and the processing chamber is sealed. The vacuum pump is then used to pump air out of the processing chamber until a substantial vacuum is created inside the chamber. The vacuum conditions promote the migration of flux residues out of the confined spaces on the printed wiring assemblies toward areas from where they can be more easily removed. The printed wiring assemblies are then washed with a solvent adapted for dissolving and removing the flux residues. In the preferred embodiment this step involves flooding the processing chamber with solvent, flushing solvent through the processing chamber and subsequently purging the chamber of free standing solvent.

In order to remove residual solvent from on the printed wiring assemblies the vacuum pump may be used a second time to pump down the processing chamber to a substantial vacuum whereby any remaining solvent can be evaporated and evacuated. Thereafter the pressure within the processing chamber can be equalized to atmospheric conditions and the printed wiring assemblies cleaned in accordance with the principles of the present invention can be removed from the processing chamber.

BRIEF DESCRIPTION OF THE DRAWINGS

FIG. 1 provides an overall block diagram of the apparatus of the present invention.

FIG. 2 provides a flow chart of the basic steps in the method of the present invention.

FIG. 3 provides a flow chart of the substeps involved in the step of washing flux residues off printed wiring assemblies shown in FIG. 2.

FIG. 4 provides a plan view of a section of a printed wiring assembly contaminated by rosin flux residues both before and after the printed wiring assemblies is subject to vacuum conditions.

DESCRIPTION OF THE PREFERRED EMBODIMENT

Referring now to FIG. 1, the present invention comprises the system 10 which is adapted for removing rosin flux residues present on printed wiring assemblies which may be resident within the confined spaces around and under the circuit components and integrated circuit chips mounted on wiring assemblies. The system 10 comprises a processing chamber 12, a solvent holding tank 14, a vacuum pump 16, a vacuum holding tank 18, a cold trap 20, and a pair of liquid-phase pumps 22 and 24. The vacuum pump 16 is connected to the processing chamber 12 by way of the vacuum holding tank 18 and the cold trap 20. The pipes 30, 32 and 34 which connect the pump 16 to the tank 18, the tank 18 to the trap 20 and the trap 20 to the chamber 12 provide the necessary conduits for the flow of gas (air) from the processing chamber 12 to the vacuum pump 16. The valves 31, 33 and 35 control flow through the pipes 30, 32 and 34 and allow the pipes to be sealed off during various stages of processing operations. The pipe 36 allows for the flow of condensed solvent material from the cold trap 20 back into the processing chamber 12 when the valve 37 is open.

The solvent holding tank 14 is connected to the processing chamber 12 by way of the pumps 22 and 24 which are adapted for pumping a solvent out of the tank 14 and into the chamber 12 and out of the chamber 12 and into the tank 14, respectively. The pipes 40, 42, 44 and 46 connect the tank 14 to the pump 22, the pump 22 to the chamber 12, the chamber 12 to the pump 24 and the pump 24 to the tank 14 and provide the necessary conduits for the flow of liquid solvent materials between the processing chamber 12 and the tank 14. The valves 43, 45 and 47 control flow through the pipes 42 and 46 and allow the pipes to be sealed off during various stages of processing operations. The pipe 50 connecting the tank 14 to the chamber 12 allows solvent from the tank 14 to surge into the processing chamber 12 under the influence of gravity and atmospheric pressure when the valve 51 is open thereby rapidly flooding the chamber with solvent. The pipe 52 allows for the equalization of pressures within the chamber 12 to atmospheric conditions during various stages of processing when the valve 53 is open.

The sequencer/timer 26 is connected by control lines 25 (not fully shown) to the pumps 16, 22 and 24 and the valves 31, 33, 35, 37, 43, 45, 47, 51 and 53 whereby the operation of the system is controlled in detail. The sequencer/timer 26 is also connected by sensor lines 27 (not fully shown) to the vacuum gauge 64 installed on the processing chamber 12 and the level indicators 66 and 68 installed in the holding tank 14 and cold trap 20.

The processing chamber 12 is adapted for maintaining a vacuum and includes a lid 70 whereby access may be gained into the chamber 12 but which is constructed so as to tightly seal the top of the chamber during processing operations. The processing chamber 12 also includes a rack 72 whereby printed wiring assemblies may be held in position within the chamber 12 during processing operation in locations where solvent material may wash over the assemblies and the assemblies may actually be submerged in solvent. The overflow pipe 74 allows the level of solvent in the chamber 12 to be maintained during various stages of processing operations with the pump 24 discharging excess solvent back to the solvent tank 14 upon overflow through the pipe 74.

The vacuum pump 16 comprises a conventional vacuum pump of the type sufficient to pump down the chamber 12 to a partial vacuum of approximately 1 mm of mercury. The vacuum holding tank 18 is of sufficient size to provide a substantial pressure reservoir so as to equalize loading on the vacuum pump 16 and speed up the pumping down of pressure within the processing chamber 12. The cold trap 20 includes cooling coils 76 cooled by liquid nitrogen and adapted for maintaining the trap 20 at very low temperatures operative for condensing solvent. The solvent tank 14 is of sufficient size to hold ample solvent for completely filling the processing chamber 12 up to the level of the overflow pipe 74 and storing the solvent when the chamber 12 is empty. The pumps 22 and 24 are conventional liquid-phase pumps selected for pumping the solvent material with the pump 24 being sized for a somewhat greater flow than the pump 22. The sequencer/timer 26 comprises a conventional microprocessor type controller for responding to manual operator commands and taking in sensory inputs and providing control signal outputs in proper sequence for controlling the overall operation of the system 10.

Referring now to FIG. 2, the first step 80 in the operation of the system 10 is for printed wiring assemblies to be loaded onto the rack 72 in the processing chamber 12 and for the lid 70 to be positioned for sealing the top of the chamber 12. As indicated in step 82, air is then pumped out of the processing chamber 12 by the vacuum pump 16 drawing down the ombient pressure within the chamber 12 until a partial vacuum approaching 1 mm of mercury is achieved. As air is drawn out of the chamber 12 pressure differentials are created with respect to the confined spaces on the wiring assemblies and especially the areas under any SMDs installed on the assemblies which force rosin flux residues to flow out from confined spaces toward the open areas on the wiring assemblies. FIG. 3 shows the results of applying a vacuum to a circuit board 100 contaminated with rosin flux residues 104 which are disposed on and around the board 100 and more particularly under the SMD 102. The vacuum causes the residues trapped within the confined spaces under the SMD 102 to migrate out from under the SMD 102 thereby forming a ring 106 of flux materials around the outer perimeter of the device 102. The application of the vacuum to the board 100 has caused the flux residues to move from previously inaccessible areas to locations from which they can be easily removed from the board 100.

Referring back to FIG. 2, the assemblies are then washed with solvent in order to dissolve and remove the flux residues in accordance with step 84. A number of different solvent mixtures and azetropes can be used for cleaning the wiring assemblies including 1,1,1,-trichlorethane, various Freon solvents, alcohols, halons and hydrocarbons such as terpenes and combinations of these solvents with ionic compounds to assist in the removal activators in the rosin flux. As shown in FIG. 2 step 84 includes three substeps 90, 92 and 94. In the step 90 solvent is allowed to surge out of the tank 14 and into the processing chamber 12 through the pipe 50 and thereby flood the chamber with solvent as the chamber is repressurized. This flooding action helps the solvent to thoroughly clean the wiring assemblies. Thereafter, in step 92, solvent is pumped out of the tank 14 and into the chamber 12 by the pump 22 while overflow is collected through the pipe 74 which is pumped back into the holding tank 14 by pump 24 in order to "flush" solvent through the processing chamber 12 so as to further promote the cleaning of the wiring assemblies within the chamber. In the step 94 solvent s pumped by the pump 24 out of the chamber 12 and back into the tank 14 until the chamber is completely drained of free standing liquid solvent.

As indicated in step 86, air is then once again pumped out of the processing chamber 12 by the vacuum pump 16 drawing down the ambiant pressure within the chamber 12 in order to create a partial vacuum approaching 1 mm of mercury chamber 12. The vacuum conditions in the chamber 12 promote the evaporation and evacuation of any of the remaining solvent from the surface of the wiring assemblies in the chamber 12 so as to leave the assemblies completely clear of solvent materials. Pursuant to step 88, the pressure within the processing chamber 12 is then allowed to equalize with atmospheric conditions and the cleaned wiring assemblies are taken out of the processing chamber 12. It should be noted that if the wiring assemblies give evidence of incomplete cleaning upon inspection subsequent to step 88, the assemblies may be reprocessed by repeating steps 80, 82, 84, 86 and 88 in accordance with step 85.

Reviewing the operation of the system 10 in somewhat greater detail, printed wiring assemblies including SMDs are placed within the processing chamber 12 on the rack 72 immediately after soldering and before flux residues have time to harden. The lid 70 is then clamped in place and all valves are closed so as to seal the chamber 12 sufficiently for a vacuum to be drawn within it. The sequencer/timer 26 is then actuated by the operator in order to begin processing operations which subsequently proceed under control of the sequencer/timer 26. The valves 31, 33 and 35 are opened so as to provide a path between the vacuum pump 16 and chamber 12. The vacuum pump 16 is turned on and air is drawn out of the chamber 12 until a partial vacuum approaching 1 mm of mercury is achieved as signalled by the vacuum gauge 64 whereupon the valves 33 and 35 are closed in order to seal off the chamber 12. The flux residues should now have migrated out of any confined spaces on the on the wiring assemblies on the rack 72 within the processing chamber 12.

The valve 51 is then opened allowing solvent from the tank 14 to surge down into the processing chamber 12 and flood over the assemblies and the rack 72 in an omnidirectional manner as the chamber is repressurized with solvent. The solvent is thereby enabled to enter confined areas under the influence of pressure differentials and capillary force which might otherwise be inaccessible and further dissolves and washes away flux residues on the assemblies. It should be noted that the solvent may be heated in order to promote its cleaning action however this is not always necessary and may in fact be undesirable with some solvents. After the processing chamber 12 is flooded with solvent, the valve 51 is closed and the valves 53, 43 and 45 are opened as the pumps 22 and 24 are turned on. Solvent is cycled between the tank 14 and the chamber 12 as it is pumped by the pump 22 into the chamber 12 and overflows into the pipe 74 and is further pumped by the pump 24 back into the tank 14. Solvent is thereby flushed through the processing chamber 12 past the assemblies on the rack 72 so as to provide further washing and cleaning action effective for the removal of flux residues. The valve 43 is then closed and the valve 47 is opened as operation of the pump 22 is shut down. All of the free standing solvent is pumped out of the processing chamber 12 into the holding tank 14 by the pump 24.

The valves 53, 45 and 47 are then closed as the valves 33 and 35 are again opened. Air is pumped out of the processing chamber by the vacuum pump 16 for a second time until a partial vacuum approaching 1 mm of mercury is again achieved within the chamber 12 as sensed by the vacuum gauge 64. Solvent is thereby evaporated and evacuated from the processing chamber 12 so that the wiring assemblies on the rack 72 are clear of solvent materials.

Concurrently, vapor phase solvent materials pumped out of the chamber 12 are passed through the cold trap 20 where they are condensed and collected for further reuse. When sufficient solvent materials are collected in the trap 20 as indicated by the level indicator 68, the valve 37 may be opened during periods when solvent is being pumped out of the processing chamber 12 in order to allow the solvent to be transferred through the processing chamber 12 to the tank 14 by way of pipe 36.

After the desired partial vacuum has been achieved within the chamber 12, the valve 53 may be opened in order to equalize the pressure within the chamber 12 to atmospheric conditions. The lid 70 may then be unclamped from the top of the chamber 12 and the printed wiring assemblies removed from the rack 72.

While particular embodiments of the present invention have been shown and described, it should be clear that changes and modifications may be made to such embodiments without departing from the true scope and spirit of the invention. It is intended that the appended claims cover all such changes and modifications.

I claim:

1. A process for cleaning rosin flux residues from printed wiring assemblies, comprising the steps of:
    placing one or more printed wiring assemblies in a vacuum sealable processing chamber;
    drawing down the ambient pressure within said chamber to achieve a partial vacuum in order to promote the migration of flux residues out of confined spaces on said assemblies;
    washing said wiring assemblies with solvent to remove flux residues which have migrated out of confined spaces on said assemblies; and
    drawing down the ambient pressure within said chamber to achieve a partial vacuum for a second time in order to evacuate any remaining solvent materials from on said assemblies.

2. The process of claim 1, wherein the step of washing said wiring assemblies includes the substeps of:
    flooding said chamber with solvent,
    flushing solvent through said chamber, and
    purging said chamber of solvent.

3. The process of claim 1, wherein said partial vacuums approach 1 mm of Mercury.

4. The process of claim 1, wherein said steps of drawing down the pressure in said chamber include the substep of:
    collecting vapor phase solvent drawn out of said chamber in a cold trap.

5. A system for cleaning rosin flux residues from printed wiring assemblies, comprising:
    a sealable processing chamber adapted for holding a plurality of wiring assemblies and for maintaining a partial vacuum during processing operations;
    vacuum pump means for drawing down the ambient pressure within said chamber in order to promote the migration of flux residues out of confined spaces on said wiring assemblies; and
    means for washing said assemblies with solvent in order to remove flux residues which have migrated out of confined spaces on said wiring assemblies.

6. The system of claim 5, wherein said means for washing includes:
    means for flooding solvent into said chamber and purging solvent out of said chamber.

7. The system of claim 6, wherein said means for flooding and purging solvent includes one or more liquid phase pumps which are further operative for flushing solvent through said chamber.

8. The system of claim 5 further including:
    a cold trap for collecting vapor phase solvent pumped out of said chamber during vacuum pump operations.

9. A process for cleaning rosin flux residues from printed wiring assemblies having SMDs installed thereon, comprising the steps of:

placing one or more wiring assemblies in a vacuum sealable processing chamber;

drawing down the ambient pressure within said chamber by pumping air out of said chamber with a vacuum pump in order to promote the migration of flux residues out from under the SMDs installed on said assemblies;

washing said wiring assemblies with solvent to remove the flux residues which have migrated out from under the SMDs.

10. The process of claim 9, further including the step of:

drawing down the ambient pressure within said chamber by pumping air out of said chamber for a second time in order to evacuate any remaining solvent materials from on said assemblies.

11. The process of claim 9, wherein the step of washing said wiring assemblies includes the substeps of:

flooding said chamber with solvent, flushing solvent through said chamber, and purging said chamber of solvent.

12. The process of claim 9, wherein the ambient pressure within said chamber is drawn down to a partial vacuum approaching 1 mm of Mercury.

13. The process of claim 12, wherein said steps of drawing down the pressure within said chamber include the substep of:

collecting vapor phase solvent pumped out of said chamber in a cold trap.

* * * * *